(12) United States Patent
Yuan et al.

(10) Patent No.: US 10,534,037 B2
(45) Date of Patent: Jan. 14, 2020

(54) DEVICES WITH BATTERY REMAINING CAPACITY ESTIMATING FUNCTIONS

(71) Applicant: O2Micro Inc., Santa Clara, CA (US)

(72) Inventors: Yi Yuan, Wuhan (CN); Yingguo Zhang, Wuhan (CN); Zhibin Hua, Shenzhen (CN); Hua-Yi Wang, Taipei (TW); Ping Liu, Shenzhen (CN)

(73) Assignee: O2Micro Inc., Santa Clara, CA (US)

( * ) Notice: Subject to any disclaimer, the term of this patent is extended or adjusted under 35 U.S.C. 154(b) by 86 days.

(21) Appl. No.: 15/939,091

(22) Filed: Mar. 28, 2018

(65) Prior Publication Data

US 2018/0217207 A1 Aug. 2, 2018

Related U.S. Application Data

(63) Continuation of application No. 13/745,299, filed on Jan. 18, 2013, now abandoned.

(30) Foreign Application Priority Data

Nov. 30, 2012 (CN) .......................... 2012 1 0507614

(51) Int. Cl.
*G01R 31/36* (2019.01)
*G01R 31/382* (2019.01)
*G06F 17/00* (2019.01)
*G01R 19/165* (2006.01)
*G01R 31/3842* (2019.01)

(52) U.S. Cl.
CPC ..... *G01R 31/382* (2019.01); *G01R 19/16542* (2013.01); *G06F 17/00* (2013.01); *G01R 31/3842* (2019.01)

(58) Field of Classification Search
CPC .......................................... G06F 17/00
USPC .......................................... 702/63
See application file for complete search history.

(56) References Cited

U.S. PATENT DOCUMENTS

| 5,325,041 | A | * | 6/1994 | Briggs ............... G01R 31/3828 320/149 |
|---|---|---|---|---|
| 5,406,566 | A | | 4/1995 | Obara |
| 5,545,969 | A | | 8/1996 | Hasegawa |
| 5,691,078 | A | | 11/1997 | Kozaki et al. |
| 5,789,923 | A | | 8/1998 | Shimoyama et al. |
| 5,793,211 | A | | 8/1998 | Shimoyama |
| 5,847,566 | A | | 12/1998 | Marritt et al. |
| 6,618,681 | B2 | | 9/2003 | Hoenig et al. |
| 7,630,842 | B2 | | 12/2009 | Murakami |
| 8,036,839 | B2 | | 10/2011 | Machiyama et al. |
| 2005/0154544 | A1 | | 7/2005 | Ono |

(Continued)

FOREIGN PATENT DOCUMENTS

CN 102073016 A 5/2011

*Primary Examiner* — Paul D Lee (57) ABSTRACT

A device includes an interface and a processor. The interface receives information for a parameter indicative of a status of a battery. The processor calculates a remaining capacity of the battery, calculates a capacity ratio of the calculated remaining capacity to a capacity reference of the battery, compares the parameter with a parameter reference to generate a first comparison result, compares the capacity ratio with a ratio reference to generate a second comparison result, sets an amount according to the first and second comparison results, and changes the calculated remaining capacity by the amount.

20 Claims, 7 Drawing Sheets

(56) References Cited

U.S. PATENT DOCUMENTS

| | | |
|---|---|---|
| 2006/0119316 A1 | 6/2006 | Sasaki et al. |
| 2006/0181245 A1* | 8/2006 | Mizuno .............. G01R 31/3648 320/132 |
| 2007/0096743 A1 | 5/2007 | Arai et al. |
| 2007/0145949 A1 | 6/2007 | Matsushima et al. |
| 2008/0116853 A1 | 5/2008 | Du |
| 2008/0157778 A1 | 7/2008 | Chou et al. |
| 2009/0027056 A1 | 1/2009 | Huang et al. |
| 2009/0030626 A1 | 1/2009 | Iwane et al. |
| 2010/0088051 A1 | 4/2010 | Iwai et al. |
| 2010/0259226 A1 | 10/2010 | Deng et al. |
| 2011/0133697 A1 | 6/2011 | Matsuura et al. |
| 2011/0234167 A1 | 9/2011 | Kao et al. |
| 2012/0029851 A1 | 2/2012 | Nakayama et al. |
| 2012/0105014 A1 | 5/2012 | Nakayama et al. |
| 2012/0116701 A1 | 5/2012 | Yuasa |
| 2012/0194130 A1 | 8/2012 | Patino et al. |
| 2012/0306450 A1 | 12/2012 | Nakayama et al. |
| 2013/0013236 A1 | 1/2013 | Takahashi |
| 2013/0041607 A1 | 2/2013 | Zimmerman et al. |
| 2013/0082664 A1 | 4/2013 | Hiraoka et al. |
| 2013/0124121 A1 | 5/2013 | Hariharasudhan et al. |
| 2013/0275067 A1 | 10/2013 | Mikuteit et al. |
| 2013/0311119 A1 | 11/2013 | Tamezane Shigeto |

* cited by examiner

DEVICES WITH BATTERY REMAINING CAPACITY ESTIMATING FUNCTIONS

RELATED APPLICATIONS

This application is a Continuation Application of the co-pending commonly-owned U.S. patent application Ser. No. 13/745,299, filed on Jan. 18, 2013, which claims priority to Patent Application No. 201210507614, filed on Nov. 30, 2012, with the State Intellectual Property Office of the People's Republic of China, which are hereby incorporated by reference in their entirety.

BACKGROUND

In a conventional method for estimating remaining capacity (RC) of a battery, the value of the remaining capacity (hereinafter, the RC value) is estimated by reading an initial RC value from a lookup table based on the open-circuit voltage of the battery, and by increasing or decreasing the RC value based on a count of charges passing in and out of the battery (referred to as "coulomb counting"). More specifically, batteries usually have certain voltage versus capacity characteristics. The lookup table lists RC values corresponding to different voltage references. In the lookup table, the RC value corresponding to each voltage reference is obtained by counting charges passing in a fully-discharged battery until an open-circuit voltage of the battery reaches the voltage reference. The counted value of the coulomb charges is the RC value corresponding to the voltage reference. This lookup table includes inaccuracies due to accumulated errors caused by the coulomb counting. In addition, a battery usually has a residual capacity left in the battery when the battery is fully discharged. The value of the residual capacity (hereinafter, the RES value) varies as the voltage, current, or temperature of the battery varies, which aggravates the inaccuracies in the estimating process.

In another conventional method for estimating remaining capacity of a battery, a residual capacity table (hereinafter, the RES table) is used to reduce the inaccuracy caused by the residual capacity. More specifically, the RES table lists RES values corresponding to different voltage references, current references, and temperature references. The remaining capacity is estimated based on the RES table, the above mentioned lookup table, and the coulomb counting method. However, to establish the RES table, the battery needs to repeat charging and discharging cycles for a large number of times and to be tested under different battery voltages, battery currents, and temperature, which is a complex and time-consuming process.

Additionally, in both of these conventional methods, when the battery is in use, e.g., being charged by a charger or being discharged to power a device, the estimating of the remaining capacity also includes inaccuracy caused by coulomb counting. A device such as a mobile phone or a tablet computer can employ the above mentioned methods to estimate a remaining capacity of a battery that powers the device. The device can further calculate a relative state of charge (RSOC) of the battery and display the RSOC on a screen of the device. The RSOC is represented by a capacity ratio of the remaining capacity to a fully-charged capacity of the battery in percentage form. Due to the inaccuracies mentioned above, the RSOC shown on the screen is different from the actual RSOC. For example, the shown RSOC may be 95% when the actual RSOC is 99%, or the shown RSOC may be 5% when the actual RSOC is 1%. Thus, at the moment when the battery is fully charged, the RSOC shown on the screen may jump from 95% to 100%. Moreover, when the battery is fully discharged, the device may unexpectedly turn off even though the RSOC on the screen shows that the battery still has remaining capacity.

SUMMARY

In one embodiment, a device includes an interface and a processor. The interface receives information for a parameter indicative of a status of a battery. The processor calculates a remaining capacity of the battery, calculates a capacity ratio of the calculated remaining capacity to a capacity reference of the battery, compares the parameter with a parameter reference to generate a first comparison result, compares the capacity ratio with a ratio reference to generate a second comparison result, sets an amount according to the first and second comparison results, and changes the calculated remaining capacity by the amount.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Embodiments described herein may be discussed in the general context of computer-executable instructions residing on some form of computer-usable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "calculating," "comparing," "generating," "changing," "multiplying," "increasing," "decreasing" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data and includes any information delivery media. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments according to the present invention estimate a remaining capacity of a battery. In one embodiment, a device calculates the remaining capacity of the battery by coulomb counting, and calibrates the value of the remaining capacity (hereinafter, the RC value) based on a status of the battery. By way of example, the device increases/decreases the RC value by an amount that is determined by checking the range of a parameter of the battery. In a charging state, the parameter includes a charging current of the battery. In a discharging state, the parameter includes a voltage across the battery. Compared with a conventional method for estimating a remaining capacity of a battery, the calibrated RC value is expected to be more accurate. Additionally, the RES table used in a conventional method is omitted, and the process of estimating the remaining capacity is simplified. Also, the remaining capacity (e.g., the relative state of charge) that is displayed to the user more accurately represents the actual remaining capacity.

Figure 1:
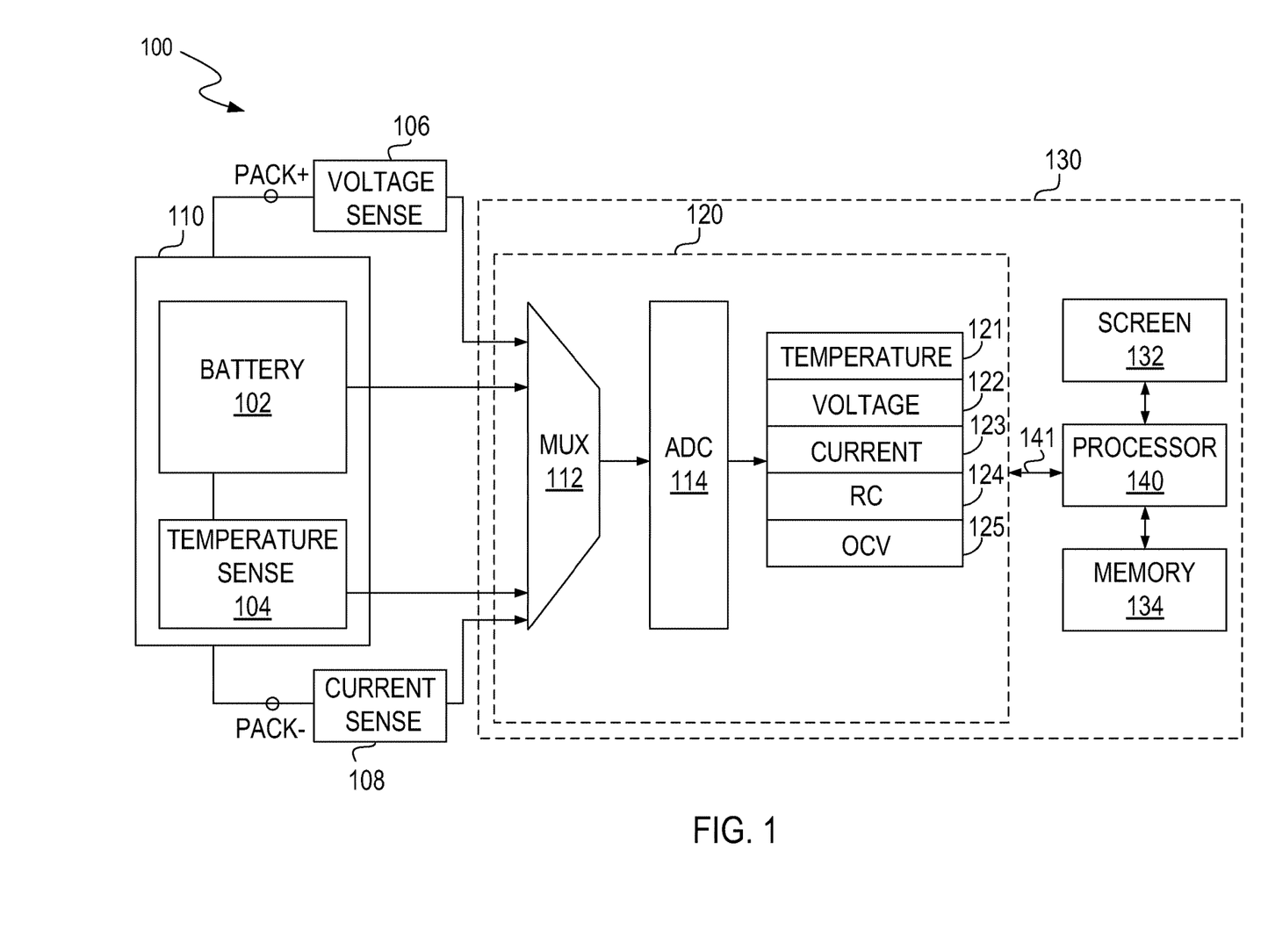
FIG. 1 illustrates a block diagram of an example of a system, in an embodiment according to the present invention.

FIG. 1 illustrates a block diagram of an example of a system 100, in an embodiment according to the present invention. The system 100 includes a battery pack 110 and a host device 130. In one embodiment, the battery pack 110 is plugged into the host device 130 to power the host device 130. The battery pack 110 can also be charged by a charger via the host device 130.

In one embodiment, the battery pack 110 includes a battery 102 having battery cells coupled, e.g., in series, and includes a temperature sense circuit 104 to sense a battery temperature of the battery 102. The system 100 further includes a voltage sense circuit 106 coupled to the battery pack 110 to sense a battery voltage $V_{BAT}$ of the battery 102, and a current sense circuit 108 coupled to the battery pack 110 to sense a battery current $I_{BAT}$ of the battery 102.

The host device 130 can be, but is not limited to, a computing device such as a desktop, a laptop, a smart phone, a palmtop, a tablet computer, etc. The host device 130 includes a battery monitor 120, a processor 140, a memory 134, and a screen 132. The battery monitor 120 includes a multiplexer 112, an analog-to-digital converter (ADC) 114, and register units. The multiplexer 112 selectively transfers information for a parameter, e.g., a battery voltage $V_{BAT}$, a battery current $I_{BAT}$, a battery temperature, etc., indicative of a status of the battery 102 to the ADC 114, and the ADC 114 converts the information into digital form. The information in digital form is stored into the register units. The register units include, but are not limited to, a temperature register unit 121 to store the value of the battery temperature, a voltage register unit 122 to store the value of the battery voltage $V_{BAT}$, a current register unit 123 to store the value of the battery current $I_{BAT}$, a remaining capacity (RC) unit 124 to store an estimated RC value of the battery 102, and an open-circuit voltage (OCV) register unit 125 to store the value of an open-circuit voltage of the battery 102. The memory 134, e.g., a non-transitory computer-readable storage device, can store computer-executable instructions that, when executed by the processor 140, cause the processor 140 to perform operations such as counting coulomb charges and calculating/estimating the remaining capacity of the battery 102. The screen 132 can display a status, e.g., the remaining capacity, a relative state of charge (RSOC), etc., of the battery 102. The processor 140 can read and execute the computer-executable instructions from the memory 134, receive battery information for the parameter indicative of the status of the battery 102 via an interface 141, e.g., a communication bus, and estimate the remaining capacity and RSOC of the battery 102 based on the computer-executable instructions and the battery status information. The processor 140 can further control the screen 132 to display the status of the battery 102.

As used herein, the term "battery temperature" means a dynamic temperature of the battery 102; the term "battery voltage $V_{BAT}$" means a dynamic voltage across the battery 102 when the battery 102 is in use, e.g., being charged by a charger or being discharged to power the host device 130; the term "battery current $I_{BAT}$" means a dynamic current flowing in or out of the battery 102, e.g., a charging current or a discharging current; and the term "open-circuit voltage" means a voltage across the battery 102 when the battery 102 is open-circuited.

As used herein, "relative state of charge" is represented by a capacity ratio of a remaining capacity to a capacity reference, e.g., a fully-charged capacity, of the battery 102 in percentage form. In one embodiment, the term "remaining capacity" means the total amount of charges $RC_{TOT}$ remaining in the battery 102, and the term "fully-charged capacity" means the total amount of charges $FC_{TOT}$ stored in the battery 102 when the battery 102 is fully charged. In one such embodiment, the value of the relative state of charge (hereinafter, RSOC value) can be given by: $RSOC=(RC_{TOT}/FC_{TOT})*100\%$.

In another embodiment, the "remaining capacity" means the amount of charges $RC_{AVA}$ remaining in and available to be discharged from the battery 102, and the term "fully-charged capacity" means the amount of charges $FC_{AVA}$ stored in and available to be discharged from the battery 102 when the battery 102 is fully charged. More specifically, the battery 102 has a residual capacity RES, e.g., some residual charges, left in the battery 102 when the battery 102 is fully discharged. When the battery 102 is not fully discharged, the available remaining capacity $RC_{AVA}$ can have the value of the total amount of charges $RC_{TOT}$ minus the value of the residual capacity RES, e.g., $RC_{AVA}=RC_{TOT}-RES$. When the battery 102 is fully charged, the available fully-charged capacity $FC_{AVA}$ can be equal to the total amount of charges $FC_{TOT}$ minus the value of the residual capacity RES, e.g., $FC_{AVA}=FC_{TOT}-RES$. In one such embodiment, the RSOC value can be given by: $RSOC=[(RC_{TOT}-RES)/(FC_{TOT}-RES)]*100\%$.

In one embodiment, the memory 134 includes a lookup table that lists RC values corresponding to different voltage references of the battery 102, and the lookup table can be used to estimate an initial RC value of the battery 102. For example, the lookup table includes an RC value $R_1$ corresponding to a voltage $V_1$, an RC value $R_2$ corresponding to a voltage $V_2$, . . . , an RC value $R_N$ corresponding to a voltage $V_N$. When the battery pack 110 is plugged into the host device 130, the battery monitor 120 receives an open-circuit voltage $V_{OPEN}$ of the battery 102 from the voltage sense circuit 106 and stores the value of the open-circuit voltage $V_{OPEN}$ in the OCV register unit 125. The processor 140 receives information for the open-circuit voltage $V_{OPEN}$ via the interface 141, and reads from the lookup table an RC value corresponding to the open-circuit voltage $V_{OPEN}$. The read RC value can be referred to as an initial RC value of the battery 102.

In one embodiment, when the battery 102 is in use, e.g., being charged or discharged, the processor 140 performs coulomb counting to calculate the amount of change ΔC in the charges of the battery 102, and calculates the remaining capacity of the battery 102 by increasing or decreasing the aforementioned initial RC value by the amount ΔC. The calculated value of the remaining capacity is stored in the RC register unit 124, and this calculated value can be referred to as a pre-stored RC value of the battery 102. In one embodiment, the term "coulomb counting" used herein means multiplying a current $I_{BAT}$, e.g., a charging current or a discharging current, of the battery 102 by the time period of the operation of the battery 102. During a charging process, when the battery 102 is close to being fully charged, the processor 140 estimates a dynamic RC value of the battery 102 based on the RC value stored in the RC register unit 124, and also based on a charge algorithm, in an embodiment according to the present invention. During a discharging process, when the battery 102 is close to being fully discharged, the processor 140 estimates a dynamic RC value of the battery 102 based on the RC value stored in the RC register unit 124, and also based on a discharge algorithm, in an embodiment according to the present invention. By using the charge algorithm and the discharge algorithm, the processor 140 can calibrate/adjust the estimated RC value so that a difference between the estimated RC value and the actual RC value of the battery 102 decreases. Hence, the estimated RC value can be calibrated/adjusted toward the actual RC value. The RSOC value shown on the screen 132 can also be calibrated/adjusted toward the actual RSOC value of the battery 102. Additionally, the RES table used in conventional methods is omitted, and the process of estimating the remaining capacity is simplified.

Figure 2:
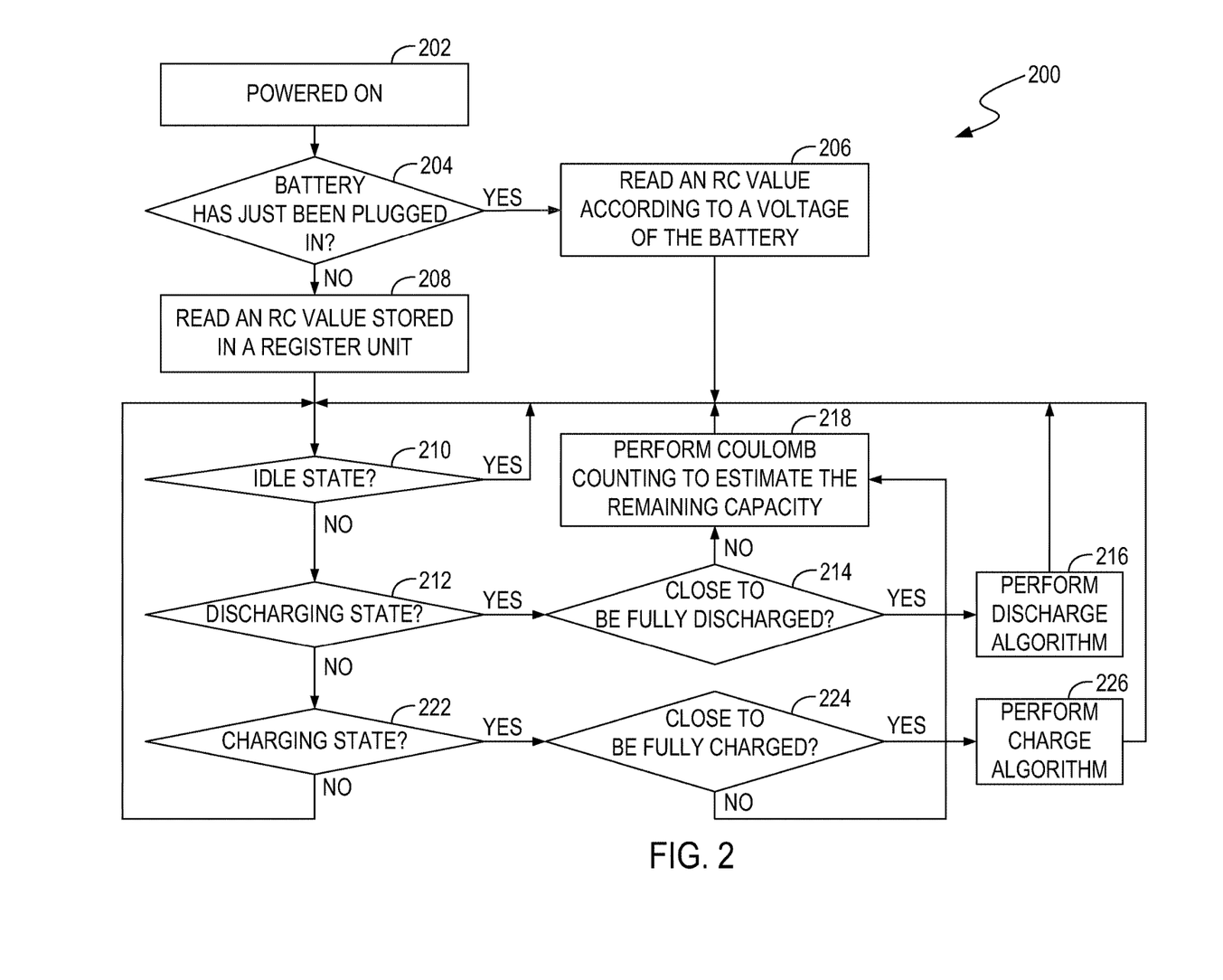
FIG. 2 illustrates an example of a flowchart for estimating a remaining capacity of a battery, in an embodiment according to the present invention.

FIG. 2 illustrates an example of a flowchart 200 for estimating a remaining capacity of a battery, in an embodiment according to the present invention. Although specific steps are disclosed in FIG. 2, such steps are examples. That is, the present invention is well suited to performing various other steps or variations of the steps recited in FIG. 2. In one embodiment, the flowchart 200 is implemented as a computer program, e.g., including computer-executable instructions, stored in a computer-readable medium, e.g., the memory 134. FIG. 2 is described in combination with FIG. 1.

In step 202, the host device 130 is powered on. In step 204, the host device 130 detects whether the battery 102 has just been plugged in. By way of example, at the moment when a battery is plugged into the host device 130, a flag signal stored in a flag register (not shown in FIG. 1) in the host device 130 can be automatically set to, e.g., digital "1." As such, the host device 130 can be informed that a battery has just been plugged in, by the flag signal, and then the host device 130 may perform initial configuration. After the initial configuration, the processor 140 can set the flag signal to, e.g., digital "0." When the battery remains plugged in the host device 130, the flag signal remains digital "0." Accordingly, in one embodiment, the battery 102 has just been plugged into the host device 130 if the flag signal is digital "1," or has been used for a while if the flag signal is digital "0." However, the invention is not so limited. In another embodiment, whether the battery 102 has just been plugged into the host device 130 or has been used for a while can be determined by another way.

In one embodiment, if the battery 102 has just been plugged into the host device 130, then the RC register unit 124 of the battery monitor 120 does not have information about the remaining capacity of the battery 102, and the flowchart 200 goes to step 206. If the battery 102 has been used for a while after the battery 102 is plugged into the host device 130, then the RC register unit 124 has the information for the remaining capacity of the battery 102, and the flowchart 200 goes to step 208.

In step 206, the battery monitor 120 receives an open-circuit voltage $V_{OPEN}$ of the battery 102 from the voltage sense circuit 106 and transfers the information for the open-circuit voltage $V_{OPEN}$ to the processor 140. The processor 140 reads, from the aforementioned lookup table, an RC value corresponding to the open-circuit voltage $V_{OPEN}$, and this RC value can be referred to as an initial RC value $RC_{INIT}$. In step 208, the processor 140 reads an RC value stored in the RC register unit 124, and this RC value can be referred to as a pre-stored RC value $RC_{PRE}$.

In step 210, the processor 140 detects whether the battery 102 is in an idle state or in use. By way of example, when the battery 102 is fully charged, the host device 130 can terminate the charging of the battery 102 and no current may flow in or out of the battery 102. In this situation, the battery 102 is in an idle state. When the processor 140 detects that the battery 102 is in use, e.g., being charged or discharged, then the flowchart 200 goes to step 212.

In step 212, the processor 140 detects whether the battery 102 is in a discharging state, e.g., being discharged to power loads such as components and circuitry in the host device 130. If the battery 102 is in the discharging state, the flowchart 200 goes to step 214; otherwise, it goes to step 222.

In step 214, the processor 140 detects whether the battery 102 is close to being fully discharged. In one embodiment, when a battery voltage $V_{BAT}$ of the battery 102 decreases to a voltage reference $V_{REF1}$, the battery 102 is close to being fully discharged. The voltage reference $V_{REF1}$ is determined by an end-of-discharge voltage $V_{EOD}$ of the battery 102. By way of example, if the battery 102 has a battery voltage $V_{EOD}$, e.g., 3.5V, when the battery 102 is fully discharged, then this battery voltage $V_{EOD}$, e.g., 3.5V, can be referred to as "end-of-discharge voltage." The voltage reference $V_{REF1}$ can be set to be, e.g., $V_{EOD}$+50 mV. In one embodiment, if the processor 140 detects that the battery 102 is close to being fully discharged, e.g., a battery voltage $V_{BAT}$ of the battery 102 has decreased to the voltage reference $V_{REF1}$, then the flowchart 200 goes to step 216; otherwise, it goes to step 218. In step 216, the processor 140 performs a discharge algorithm to estimate the remaining capacity of the battery 102, which is further detailed in FIG. 5.

In step 222, the processor 140 detects whether the battery 102 is in a charging state, e.g., being charged via the host device 130. If the battery 102 is in the charging state, the flowchart 200 goes to step 224; otherwise, it goes to step 210.

In step 224, the processor 140 detects whether the battery 102 is close to being fully charged. In one embodiment, when a battery voltage $V_{BAT}$ of the battery 102 increases to a voltage reference $V_{REF2}$ of the battery 102, the battery 102 is close to being fully charged. By way of example, in the charging state, a battery voltage $V_{BAT}$ of the battery 102 can increase until it reaches a constant-voltage threshold $V_{CV}$. When the battery voltage $V_{BAT}$ reaches the constant-voltage threshold $V_{CV}$, the battery 102 enters a constant-voltage charging mode, the battery voltage $V_{BAT}$ can remain substantially constant, and the charging current $I_{BAT}$ of the battery 102 starts to decrease. In one embodiment, the voltage reference $V_{REF2}$ is the constant-voltage threshold $V_{CV}$. In another embodiment, the voltage reference $V_{REF2}$ is slightly less than the constant-voltage threshold $V_{CV}$. In one embodiment, if the processor 140 detects that the battery 102 is close to being fully charged, e.g., a battery voltage $V_{BAT}$ of the battery 102 has increased to the voltage reference $V_{REF2}$, then the flowchart 200 goes to step 226; otherwise, it goes to step 218. In step 226, the processor 140 performs a charge algorithm to estimate the remaining capacity of the battery 102, which is further detailed in FIG. 3.

In step 218, the processor 140 performs coulomb counting to calculate the remaining capacity of the battery 102. By way of example, the processor 140 can repeat the coulomb counting at a predetermined frequency $1/T_{PRE}$. In other words, in each cycle period $T_{PRE}$, the processor 140 counts the charges passing in and out of the battery 102. The processor 140 calculates the amount of charges ΔC by multiplying a current $I_{BAT}$, e.g., a charging current or a discharging current, of the battery 102 by the time period of operation of the battery 102, e.g., the cycle period $T_{PR}$. Thus, the amount ΔC is given by: $\Delta C = I_{BAT} * T_{PRE}$. If the battery 102 is in the discharging state, then the processor 140 decreases the RC value (e.g., the initial RC value $RC_{INIT}$ obtained by the step 206 or the pre-stored RC value $RC_{PRE}$ obtained by the step 208) by the amount ΔC, and stores the updated RC value to the RC register unit 124. If the battery 102 is in the charging state, then the processor 140 increases the RC value by the amount ΔC, and stores the updated RC value to the RC register unit 124.

Figure 3:
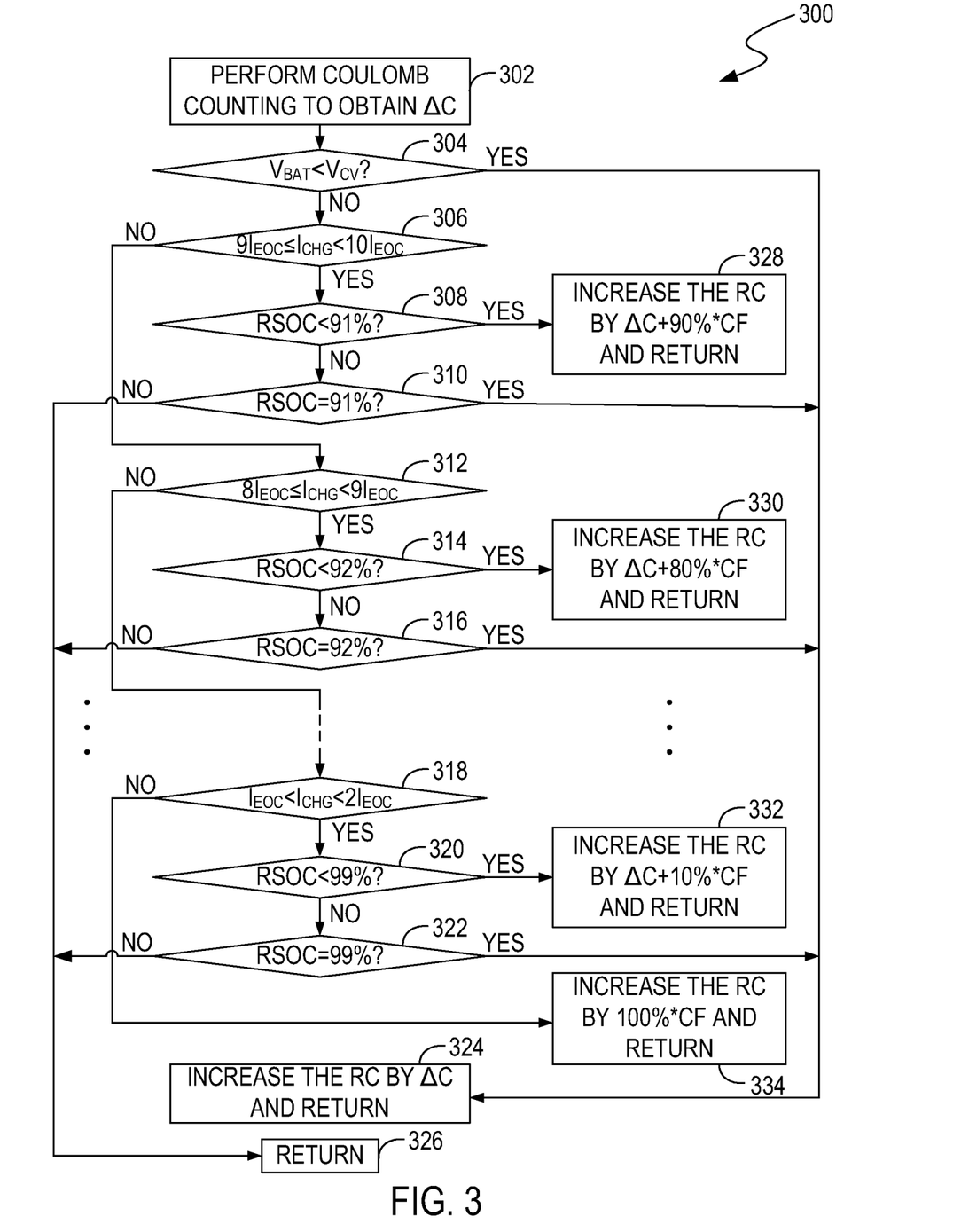
FIG. 3 illustrates an example of a flowchart for estimating a remaining capacity of a battery using a charge algorithm, in an embodiment according to the present invention.

FIG. 3 illustrates an example of a flowchart 300 for estimating a remaining capacity of a battery using a charge algorithm, e.g., the charge algorithm mentioned in step 226 of FIG. 2, in an embodiment according to the present invention. Although specific steps are disclosed in FIG. 3, such steps are examples. That is, the present invention is well suited to performing various other steps or variations of the steps recited in FIG. 3. In one embodiment, the flowchart 300 is implemented as a computer program, e.g., including computer-executable instructions, stored in a computer-readable medium, e.g., the memory 134. FIG. 3 is described in combination with FIG. 1 and FIG. 2.

In one embodiment, the processor 140 performs the steps in the flowchart 300 to calculate a remaining capacity of the battery 102 and calculate a capacity ratio of the calculated remaining capacity to a capacity reference of the battery 102. The processor 140 also compares a parameter of the battery 102 with a parameter reference to generate a first comparison result, compares the capacity ratio with a ratio reference to generate a second comparison result, sets an amount of increment $\Delta RC_1$ according to the first and second comparison results, and changes the calculated remaining capacity by the amount of increment $\Delta RC_1$. In one embodiment, the capacity reference includes a fully-charged capacity of battery 102 defined above, and the capacity ratio is the relative state of charge (RSOC) defined above. In the example of FIG. 3, the parameter includes a charging current $I_{CHG}$ of the battery 102, and the processor 140 compares the charging current $I_{CHG}$ with a current reference to generate the first comparison result. The processor 140 increases the calculated remaining capacity according to the first and second comparison results.

More specifically, in step 302, the processor 140 performs coulomb counting to obtain the amount of change ΔC in the charges of the battery 102. In step 304, the processor 140 compares a battery voltage $V_{BAT}$ of the battery 102 with a voltage reference, e.g., a constant-voltage threshold $V_{CV}$ of the battery 102. If the battery voltage $V_{BAT}$ is less than the constant-voltage threshold $V_{CV}$, then the flowchart 300 goes to step 324; otherwise, it goes to step 306.

In step 324, the processor 140 sets the increment $\Delta RC_1$ to the amount ΔC obtained by step 302, and increases the RC value by the amount ΔC. The computer program of the flowchart 300 returns an updated RC value RC+ΔC, and the processor 140 stores the updated RC value RC+ΔC in the RC register unit 124. In other words, if the battery voltage $V_{BAT}$ is less than the constant-voltage threshold $V_{CV}$, then the processor 140 can perform the coulomb counting to estimate the RC value, similar to the step 218 of FIG. 2.

In step 306, the processor 140 compares the charging current $I_{CHG}$ with a first current reference and a second current reference to determine a range of the charging current $I_{CHG}$. More specifically, in one embodiment, when the battery 102 operates in a constant-current charging mode, the charging current $I_{CHG}$ can have a substantially constant value $I_{CV}$, and the battery voltage $V_{BAT}$ increases. When the battery voltage $V_{BAT}$ increases to the constant-voltage threshold $V_{CV}$, the battery 102 enters a constant-voltage charging mode, and the charging current $I_{CHG}$ decreases if the battery 102 continues to be charged. In one embodiment, when the charging current $I_{CHG}$ decreases to an end-of-charge current $I_{EOC}$, the battery 102 is considered to be fully charged. In the example of FIG. 3, the end-of-charge current $I_{EOC}$ is one-tenth of the constant value $I_{CV}$; however, embodiments according to the invention are not so limited. In the example of FIG. 3, in step 306, the processor 140 compares the charging current $I_{CHG}$ with a current reference $9I_{EOC}$ and a current reference $10I_{EOC}$, e.g., the constant value $I_{CV}$, to determine whether the charging current $I_{CHG}$ is within a range $[9I_{EOC}, 10I_{EOC})$. In one embodiment, $[\alpha, \beta)$ represents a range from a boundary value $\alpha$ to a boundary value $\beta$, including the boundary value $\alpha$ and excluding the boundary value $\beta$.

Continuing with the example, if the charging current $I_{CHG}$ is not within the range $[9I_{EOC}, 10I_{EOC})$, e.g., the charging current $I_{CHG}$ is less than the current reference $9I_{EOC}$, then the flowchart 300 goes to step 312. In step 312, the processor 140 decreases the first and second current references, and compares the charging current $I_{CHG}$ with the next set of decreased current references, e.g., current references $8I_{EOC}$ and $9I_{EOC}$. Similarly, if the charging current $I_{CHG}$ is less than the current reference $8I_{EOC}$, then the processor 140 further decreases the first and second current references to yet another set of decreased current references, and compares the charging current $I_{CHG}$ with those decreased current references. The processor 140 can repeat the comparing process until the processor 140 determines the range of the charging current $I_{CHG}$.

In one embodiment, the processor 140 increases the aforementioned ratio reference if the first and second current references are decreased. By way of example, in step 306, if the charging current $I_{CHG}$ is detected to be within the range $[9I_{EOC}, 10I_{EOC})$, then the processor 140 performs step 308 to compare the RSOC value with a ratio reference 91%. In step 312, if the charging current $I_{CHG}$ is detected to be within the range $[8I_{EOC}, 9I_{EOC})$, then the processor 140 performs step 314 to compare the RSOC value with a ratio reference 92%. Similarly, in step 318, if the charging current $I_{CHG}$ is detected to be within the range $(I_{EOC}, 2I_{EOC})$, then the processor 140 performs step 320 to compare the RSOC value with a ratio reference 99%. In other words, the processor 140 determines whether the charging current $I_{CHG}$ is within a range defined by the first and second current references. If the charging current $I_{CHG}$ is within the range, then the processor 140 further compares the RSOC value with a ratio reference corresponding to the range. If the charging current $I_{CHG}$ is not within the range, then the processor 140 decreases the first and second current references, and also increases the ratio reference.

As shown in FIG. 3, if the charging current $I_{CHG}$ is within the range $[9I_{EOC}, 10I_{EOC})$, e.g., the charging current $I_{CHG}$ is less than the current reference $10I_{EOC}$ and is equal to or greater than the current reference $9I_{EOC}$, and if the RSOC value is less than the ratio reference 91%, then the flowchart 300 goes to step 328. In step 328, the processor 140 sets the amount of increment $\Delta RC_1$ to be, e.g., $\Delta C+90\%*CF$, and increases the RC value by the amount $\Delta C+90\%*CF$. Similarly, if the charging current $I_{CHG}$ is within the range $[8I_{EOC}, 9I_{EOC})$, and the RSOC value is less than the ratio reference 92%, then the flowchart 300 goes to step 330. In step 330, the processor 140 sets the increment $\Delta RC_1$ to be, e.g., $\Delta C+80\%*CF$, and increases the RC value by the amount $\Delta C+80\%*CF$. Operations of setting the increment $\Delta RC_1$ and increasing the RC value by the increment $\Delta RC_1$, corresponding to the ranges $[7I_{EOC}, 8I_{EOC}), \ldots, [2I_{EOC}, 3I_{EOC})$, are performed in a similar manner, and therefore are not repetitively detailed herein. If the charging current $I_{CHG}$ is within the range $(I_{EOC}, 2I_{EOC})$, e.g., the charging current $I_{CHG}$ is less than the current reference $2I_{EOC}$ and greater than the end-of-charge current $I_{EOC}$, and if the RSOC value is less than the ratio reference 99%, then the flowchart 300 goes to step 332. In step 332, the processor 140 sets the increment $\Delta RC_1$ to be, e.g., $\Delta C+10\%*CF$, and increases the RC value by the increment $\Delta C+10\%*CF$. In one embodiment, because the rate of increase of the actual remaining capacity of the battery 102 decreases when the charging current $I_{CHG}$ decreases, the processor 140 can, but not necessarily, decrease the increment $\Delta RC_1$ when the charging current $I_{CHG}$ decreases as illustrated in the example of FIG. 3.

In one embodiment, the parameter CF is referred to as a "catching factor," and is equal to 1% of the fully-charged capacity of the battery 102. For example, a battery for a smartphone may have a fully-charged capacity of 1600 mAH (milliampere-hour), and 1% of its fully-charged capacity is 16 mAH. For another example, a battery for a tablet computer may have a fully-charged capacity of 7000 mAH, and 1% of its fully-charged capacity is 70 mAH. The increments $\Delta C+90\%*CF$, $\Delta C+80\%*CF$ and $\Delta C+10\%*CF$ disclosed in the steps 328, 330, and 332 are not intended to limit the invention. In another embodiment, the increments $\Delta RC_1$ set in steps 328, 330 and 332, and in other similar steps (not shown in FIG. 3) can have any value as long as the increments $\Delta RC_1$ are greater than the amount $\Delta C$ and less than the caching factor CF, e.g., 1% of the fully-charged capacity of the battery 102.

Moreover, in step 310, if the RSOC value is detected to be equal to 91%, then the flowchart 300 goes to step 324 to increase the RC value by the amount $\Delta C$ and returns the updated RC value $RC+\Delta C$. If the RSOC value is detected to be greater than 91%, then the flowchart 300 goes to step 326. In step 326, the processor 140 keeps the RC value unchanged and the computer program of the flowchart 300 returns the unchanged RC value. Similar descriptions for steps 316 and 322 are omitted.

Furthermore, in step 318, if the charging current $I_{CHG}$ is detected to have decreased to the end-of-charge current $I_{EOC}$, then the flowchart 300 goes to step 334. In step 334, the processor 140 increases the RC value by the amount $100\%*CF$ and the computer program of the flowchart 300 returns an updated RC value $RC+100\%*CF$.

Figure 4:
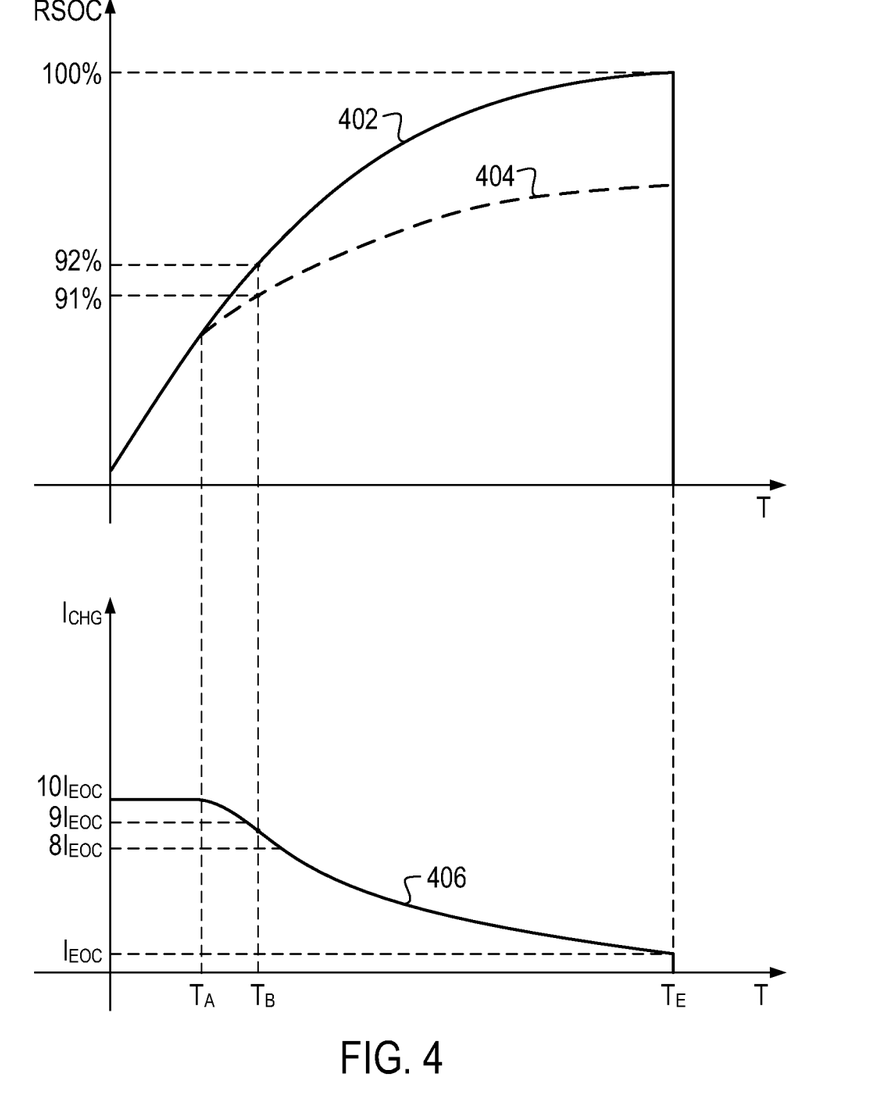
FIG. 4 illustrates examples of plots for a remaining capacity and a battery current associated with a battery, in an embodiment according to the present invention.

FIG. 4 illustrates examples of plots for the remaining capacity and the charging current $I_{CHG}$ described in relation to FIG. 3, in an embodiment according to the present invention. FIG. 4 is described in combination with FIG. 3. In one embodiment, the curve 402 represents the RSOC value obtained by performing the flowchart 300, the curve 404 represents the RSOC value obtained simply by coulomb counting without performing the flowchart 300, and the curve 406 represents the charging current $I_{CHG}$.

As shown in FIG. 4, at time $T_A$, the charging current $I_{CHG}$ starts to decrease, and the battery 102 is close to being fully charged. The charging current $I_{CHG}$ decreases as the RSOC of the battery 102 increases. In one embodiment, by performing the steps in the flowchart 300, the RSOC value can be controlled to be, for example, 91% when the charging current $I_{CHG}$ is within the range $[9I_{EOC}, 10I_{EOC})$, 92% when the charging current $I_{CHG}$ is within the range $[8I_{EOC}, 9I_{EOC})$, ..., and 99% when the charging current $I_{CHG}$ is within the range $(I_{EOC}, 2I_{EOC})$. In addition, the RSOC value can be controlled to be 100% when the charging current $I_{CHG}$ has decreased to the end-of-charge current $I_{EOC}$.

By way of example, at time $T_B$ in FIG. 4, the charging current $I_{CHG}$ is within the range $[8I_{EOC}, 9I_{EOC})$, and the RSOC value at the curve 404 is 91%. Therefore, the processor 140 performs step 330 of the flowchart 300 to increase the RC value by an increment $\Delta RC_1$, e.g., $\Delta RC_1 = \Delta C + 80\% * CF$. Thus, the RSOC value increases toward 92%. As mentioned above, the increment $\Delta RC_1$ is less than 1% of the fully-charged capacity of the battery 102, and therefore the RSOC value does not jump from 91% to 93% after the RC value is increased.

Consequently, compared with conventional methods for estimating a remaining capacity of a battery, the RC value obtained by performing the flowchart 300 can be closer to the actual RC value, and the RSOC value shown on the screen 132 can be closer to the actual RSOC value of the battery 102. In addition, the RSOC value shown on the screen 132 does not change discontinuously.

Figure 5:
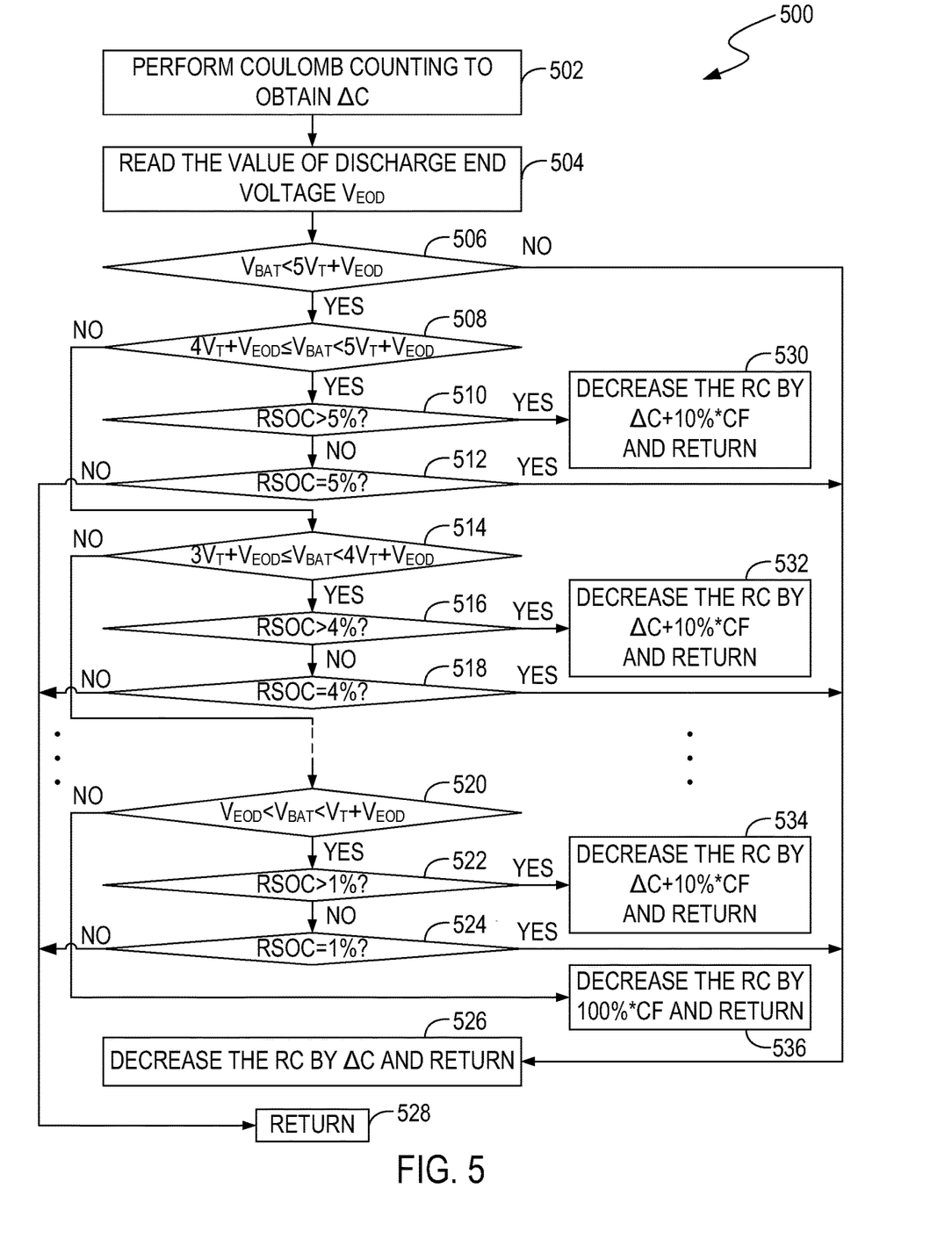
FIG. 5 illustrates an example of a flowchart for estimating a remaining capacity of a battery using a discharge algorithm, in an embodiment according to the present invention.

FIG. 5 illustrates an example of a flowchart 500 for estimating a remaining capacity of a battery using a discharge algorithm, e.g., the discharge algorithm mentioned in step 216 of FIG. 2, in an embodiment according to the present invention. Although specific steps are disclosed in FIG. 5, such steps are examples. That is, the present invention is well suited to performing various other steps or variations of the steps recited in FIG. 5. In one embodiment, the flowchart 500 is implemented as a computer program, e.g., including computer-executable instructions, stored in a computer-readable medium, e.g., the memory 134. FIG. 5 is described in combination with FIG. 1 and FIG. 2.

In one embodiment, the processor 140 performs the steps in the flowchart 500 to calculate a remaining capacity of the battery 102 and calculate a capacity ratio, e.g., an RSOC value, of the battery 102. The processor 140 also compares a parameter of the battery 102 with a parameter reference to generate a first comparison result, compares the capacity ratio with a ratio reference to generate a second comparison result, sets an amount of decrement $\Delta RC_2$ according to the first and second comparison results, and changes the calculated remaining capacity by the amount of decrement $\Delta RC_2$. In the example of FIG. 5, the parameter includes a battery voltage $V_{BAT}$ of the battery 102, and the processor 140 compares the battery voltage $V_{BAT}$ with a voltage reference to generate the first comparison result. The processor 140 decreases the calculated remaining capacity according to the first and second comparison results.

More specifically, in step 502, the processor 140 performs coulomb counting to obtain the amount of change $\Delta C$ in the charges of the battery 102. In step 504, the processor 140 can read an end-of-discharge voltage $V_{EOD}$ of the battery 102 from a table. More specifically, in one embodiment, a battery voltage $V_{BAT}$ of the battery 102 decreases in a discharging state. When the battery voltage $V_{BAT}$ decreases to the end-of-discharge voltage $V_{EOD}$, the battery 102 is considered to be fully discharged. In one embodiment, the memory 134 further includes a table that lists values of the end-of-discharge voltage $V_{EOD}$ corresponding to different battery temperatures. The processor 140 can read an end-of-discharge voltage $V_{EOD}$ from the table according to a battery temperature received from the temperature sense circuit 104. In another embodiment, the end-of-discharge voltage $V_{EOD}$ is a preset voltage independent of the battery temperature. In one such embodiment, the step 504 can be skipped.

In step 506, the processor 140 compares the battery voltage $V_{BAT}$ with a voltage reference, e.g., $5V_T + V_{EOD}$. In one embodiment, when the RSOC of the battery 102 is 5%, the battery 102 has a voltage $V_{TEST}$. The voltage reference $V_T$ can be chosen such that a difference between the voltage reference $5V_T + V_{EOD}$ and the voltage $V_{TEST}$ is less than a predetermined limit. In step 506, if the battery voltage $V_{BAT}$ is equal to or greater than the voltage reference $5V_T + V_{EOD}$, then the flowchart 500 goes to step 526; otherwise, it goes to step 508.

In step 526, the processor 140 sets the decrement $\Delta RC_2$ to be the amount $\Delta C$ obtained by step 502, and decreases the RC value by the amount $\Delta C$. The computer program of the flowchart 500 returns an updated RC value $RC - \Delta C$, and the processor 140 stores the updated RC value $RC - \Delta C$ in the RC register unit 124. In other words, if the battery voltage $V_{BAT}$ is equal to or greater than the voltage reference $5V_T + V_{EOD}$, then the processor 140 can perform the coulomb counting to estimate the RC value, similar to the step 218 of FIG. 2.

In step 508, the processor 140 compares the battery voltage $V_{BAT}$ with a first voltage reference, e.g., $4V_T + V_{EOD}$, and a second voltage reference, e.g., $5V_T + V_{EOD}$, to determine a range of the battery voltage $V_{BAT}$. More specifically, the processor 140 compares the battery voltage $V_{BAT}$ with the voltage references $4V_T + V_{EOD}$ and $5V_T + V_{EOD}$ to determine whether the battery voltage $V_{BAT}$ is within the range $[4V_T + V_{EOD}, 5V_T + V_{EOD})$.

If the battery voltage $V_{BAT}$ is not within the range $[4V_T + V_{EOD}, 5V_T + V_{EOD})$, e.g., the battery voltage $V_{BAT}$ is less than the voltage reference $4V_T + V_{EOD}$, then the flowchart 500 goes to step 514. In step 514, the processor 140 decreases the first and second voltage references, and compares the battery voltage $V_{BAT}$ with the next set of decreased voltage references, e.g., voltage references $3V_T + V_{EOD}$ and $4V_T + V_{EOD}$. Similarly, if the battery voltage $V_{BAT}$ is less than the voltage reference $3V_T + V_{EOD}$, then the processor 140 further decreases the first and second voltage references to yet another set of decreased voltage references, and compares the battery voltage $V_{BAT}$ with those decreased voltage references. The processor 140 can repeat the comparing process until the processor 140 determines the range of the battery voltage $V_{BAT}$.

In one embodiment, the processor 140 decreases the aforementioned ratio reference if the first and second voltage references are decreased. By way of example, in step 508, if the battery voltage $V_{BAT}$ is detected to be within the range $[4V_T + V_{EOD}, 5V_T + V_{EOD})$, then the processor 140 performs step 510 to compare the RSOC value with a ratio reference 5%. In step 514, if the battery voltage $V_{BAT}$ is detected to be within the range $[3V_T + V_{EOD}, 4V_T + V_{EOC})$, then the processor 140 performs step 516 to compare the RSOC value with a ratio reference 4%. Similarly, in step 520, if the battery voltage $V_{BAT}$ is detected to be within the range $(V_{EOD}, V_T + V_{EOD})$, then the processor 140 performs step 522 to compare the RSOC value with a ratio reference 1%. In other words, the processor 140 determines whether the battery voltage $V_{BAT}$ is within a range defined by the first and second voltage references. If the battery voltage $V_{BAT}$ is within the range, then the processor 140 further compares the RSOC value with a ratio reference corresponding to the range. If the battery voltage $V_{BAT}$ is not within the range, then the processor 140 decreases the first and second voltage references, and also decreases the ratio reference.

As shown in FIG. 5, if the battery voltage $V_{BAT}$ is within the range $[4V_T + V_{EOD}, 5V_T + V_{EOD})$, e.g., the battery voltage $V_{BAT}$ is less than the voltage reference $5V_T + V_{EOD}$ and is equal to or greater than the voltage reference $4V_T+V_{EOD}$, and if the RSOC value is greater than the ratio reference 5%, then the flowchart 500 goes to step 530. In step 530, the processor 140 sets the amount of decrement $\Delta RC_2$ to be, e.g., $\Delta C+10\%*CF$, and decreases the RC value by the amount $\Delta C+10\%*CF$. Similarly, if the battery voltage $V_{BAT}$ is within the range $[3V_T+V_{EOD}, 4V_T+V_{EOC})$, and the RSOC value is greater than the ratio reference 4%, then the flowchart 500 goes to step 532. In step 532, the processor 140 sets the decrement $\Delta RC_2$ to be, e.g., $\Delta C+10\%*CF$, and decreases the RC value by the amount $\Delta C+10\%*CF$. Operations of setting the decrement $\Delta RC_2$ and decreasing the RC value by the decrement $\Delta RC_2$, corresponding to the ranges $[2V_T+V_{EOD}, 3V_T+V_{EOD})$ and $[V_T+V_{EOD}, 2V_T+V_{EOD})$ are performed in a similar manner, and therefore are not repetitively detailed herein. If the battery voltage $V_{BAT}$ is within the range $(V_{EOD}, V_T+V_{EOD})$, e.g., the battery voltage $V_{BAT}$ is less than the voltage reference $V_T+V_{EOD}$ and greater than the end-of-discharge voltage $V_{EOD}$, and if the RSOC value is greater than the ratio reference 1%, then the flowchart 500 goes to step 534. In step 534, the processor 140 sets the decrement $\Delta RC_2$ to be, e.g., $\Delta C+10\%*CF$, and decreases the RC value by the amount $\Delta C+10\%*CF$.

The decrements $\Delta C+10\%*CF$ disclosed in the steps 530, 532, and 534 are not intended to limit the invention. In another embodiment, the decrements $\Delta RC_2$ set in steps 530, 532, and 534, and in other similar steps (not shown in FIG. 5) can have any value as long as the decrements $\Delta RC_2$ are greater than the amount $\Delta C$ and less than the catching factor CF (e.g., 1% of the fully-charged capacity of the battery 102).

Moreover, in step 512, if the RSOC value is detected to be equal to, e.g., 5%, then the flowchart 500 goes to step 526 to decrease the RC value by the mount $\Delta C$ and returns the updated RC value $RC-\Delta C$. If the RSOC value is detected to be less than 5%, then the flowchart 500 goes to step 528. In step 528, the processor 140 keeps the RC value unchanged and the computer program of the flowchart 500 returns the unchanged RC value. Similar descriptions for steps 518 and 524 are omitted.

Furthermore, in step 520, if the battery voltage $V_{BAT}$ is detected to have decreased to the end-of-discharge battery $V_{EOD}$, then the flowchart 500 goes to step 536. In step 536, the processor 140 decreases the RC value by the amount $100\%*CF$ and the computer program of the flowchart 500 returns an updated RC value $RC-100\%*CF$.

Figure 6:
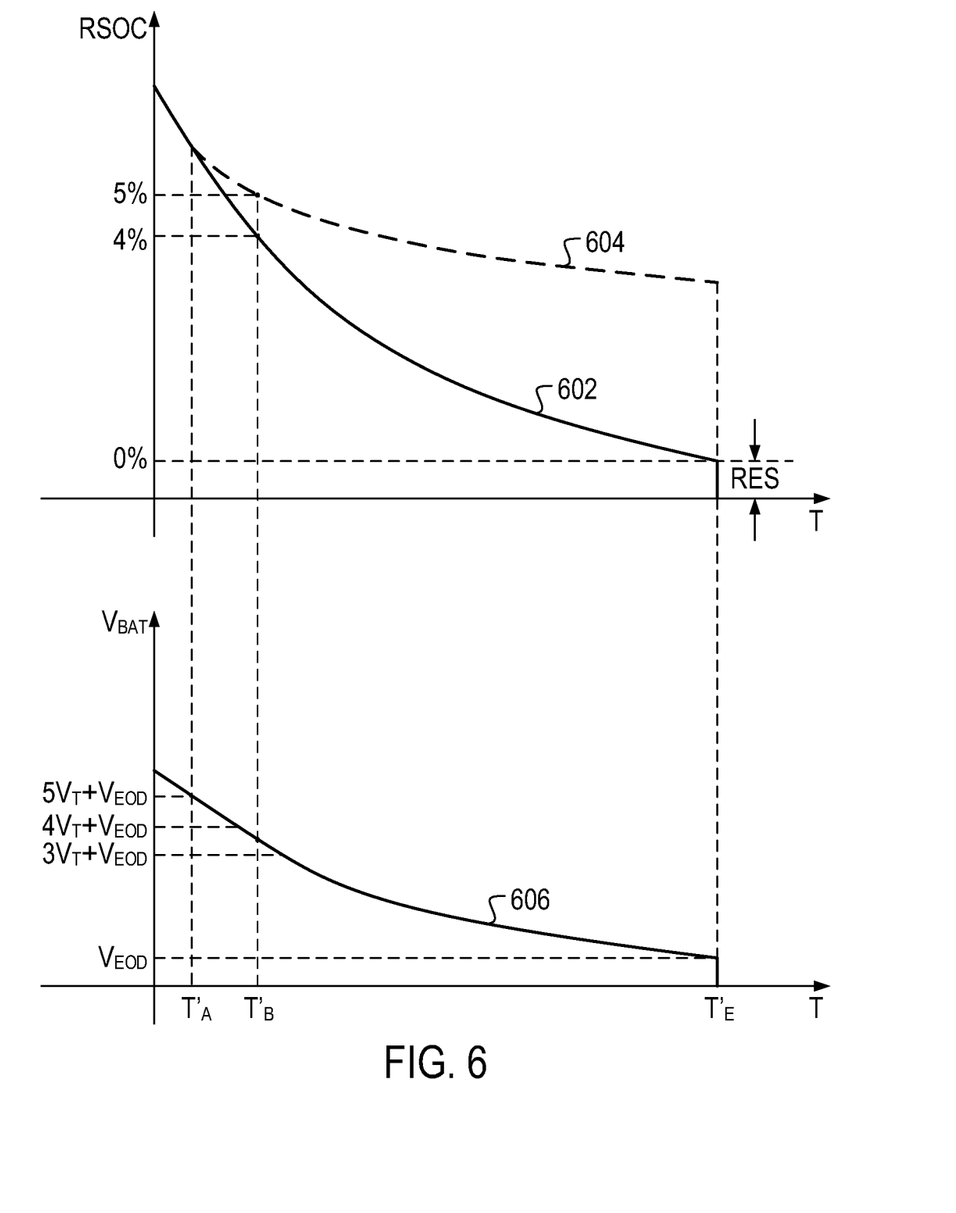
FIG. 6 illustrates examples of plots for a remaining capacity and a battery voltage associated with a battery, in an embodiment according to the present invention.

FIG. 6 illustrates examples of plots for the remaining capacity and the battery voltage $V_{BAT}$ described in relation to FIG. 5, in an embodiment according to the present invention. FIG. 6 is described in combination with FIG. 5. In one embodiment, the curve 602 represents the RSOC value obtained by performing the flowchart 500, the curve 604 represents the RSOC value obtained simply by coulomb counting without performing the flowchart 500, and the curve 606 represents the battery voltage $V_{BAT}$.

As shown in FIG. 6, at time $T'_A$, the battery voltage $V_{BAT}$ decreases to the voltage reference $5V_T+V_{EOD}$, and the battery 102 is close to being fully discharged. The battery voltage $V_{BAT}$ decreases as the RSOC of the battery 102 decreases. In one embodiment, by performing the steps in the flowchart 500, the RSOC value can be controlled to be, e.g., 5% when the battery voltage $V_{BAT}$ is within the range $[4V_T+V_{EOD}, 5V_T+V_{EOD})$, 4% when the battery voltage $V_{BAT}$ is within the range $[3V_T+V_{EOD}, 4V_T+V_{EOD})$, . . . , and 1% when the battery voltage $V_{BAT}$ is within the range $(V_{EOD}, V_T+V_{EOD})$. In addition, the RSOC value can be controlled to be 0% when the battery voltage $V_{BAT}$ has decreased to the end-of-discharge voltage $V_{EOD}$.

By way of example, at time $T'_B$ in FIG. 6, the battery voltage $V_{BAT}$ is within the range $[3V_T+V_{EOD}, 4V_T+V_{EOD})$, and the RSOC value at the curve 604 is 5%, and therefore the processor 140 performs step 532 of the flowchart 500 to decrease the RC value by a decrement $\Delta RC_2$, e.g., $\Delta RC_2=\Delta C+10\%*CF$. Thus, the RSOC value decreases toward 4%. As mentioned above, the decrement $\Delta RC_2$ is less than 1% of the fully-charged capacity of the battery 102, and therefore the RSOC value does not jump from 5% to 3% after the RC value is decreased.

Consequently, compared with conventional methods for estimating a remaining capacity of a battery, the RC value obtained by performing the flowchart 500 can be closer to the actual RC value, and the RSOC value shown on the screen 132 can be closer to the actual RSOC value of the battery 102. In addition, the RSOC value shown on the screen 132 does not change discontinuously.

Figure 7:
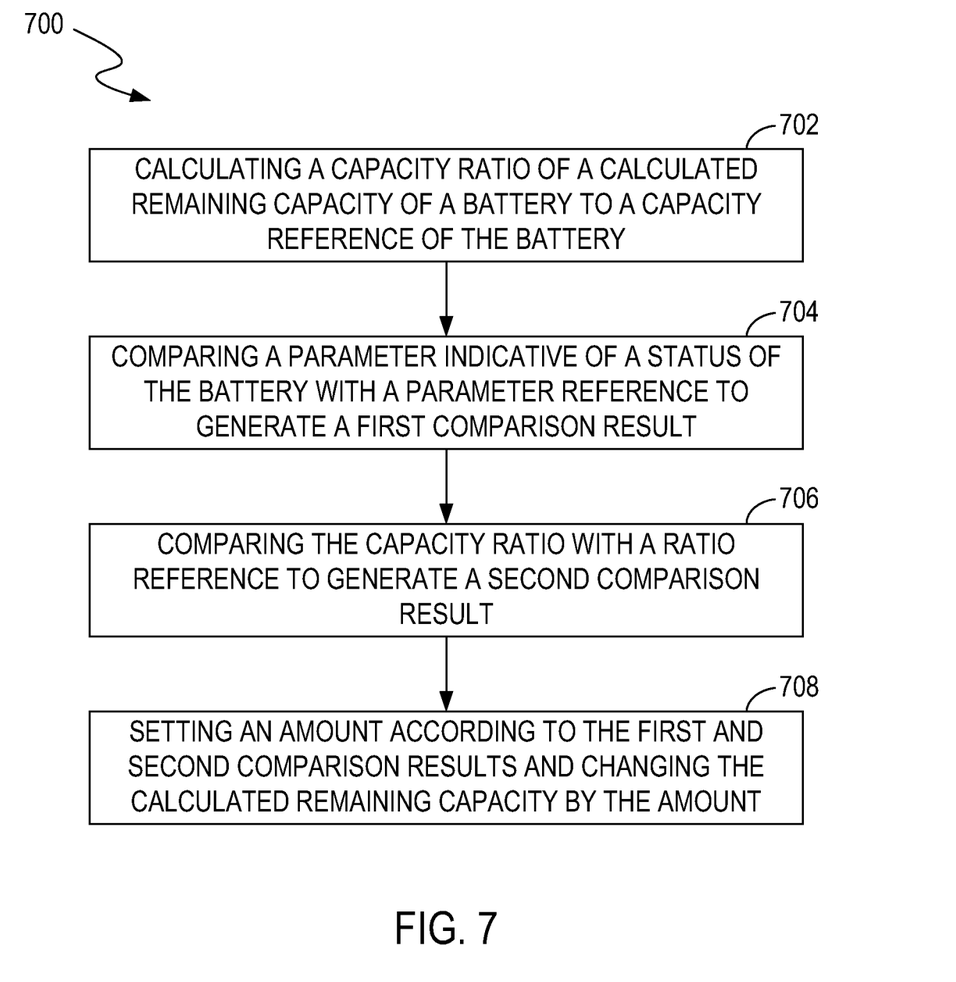
FIG. 7 illustrates a flowchart of examples of operations performed by a device, in an embodiment according to the present invention.

FIG. 7 illustrates a flowchart 700 of examples of operations performed by a device, e.g., the host device 130 in FIG. 1, in an embodiment according to the present invention. In one embodiment, the flowchart 700 is implemented as a computer program, e.g., including computer-executable instructions, stored in a computer-readable medium, e.g., the memory 134. FIG. 7 is described in combination with FIG. 1, FIG. 2, FIG. 3, FIG. 4, FIG. 5 and FIG. 6.

In step 702, the processor 140 calculates a capacity ratio, e.g., the above mentioned RSOC, of a calculated remaining capacity of the battery 102 to a capacity reference, e.g., a fully-charged capacity, of the battery 102.

In step 704, the processor 140 compares a parameter, e.g., a charging current $I_{CHG}$ in a charging state or a battery voltage $V_{BAT}$ in a discharging state, indicative of a status of the battery 102 with a parameter reference, e.g., the current references mentioned in FIG. 3 or the voltage reference mentioned in FIG. 5, to generate a first comparison result.

In step 706, the processor 140 compares the capacity ratio, e.g., the RSOC, with a ratio reference, e.g., the ratio references in FIG. 3 or FIG. 5, to generate a second comparison result.

In step 708, the processor 140 sets an amount of change, e.g., an increment $\Delta RC_1$ or a decrement $\Delta RC_2$, according to the first and second comparison results, and changes the calculated remaining capacity by the amount.

In summary, embodiments according to the present invention provide methods for estimating an RC (remaining capacity) value and RSOC (relative state of charge) value of a battery, and devices that implement those methods. In one embodiment, during a charging process, the range of the battery current is determined and an increment is determined according to the range. The RC value of the battery is increased by the increment. In another embodiment, during a discharging process, the range of the battery voltage is determined and a decrement is determined according to the range. The RC value of the battery is decreased by the decrement. As a result, the estimated RC value and ROSC value are adjusted toward the actual RC value and ROSC value. Embodiments according to the present invention can be used in any kind of device which is operable for estimating a remaining capacity of a battery. The device can be, but is not limited to, a desktop, a laptop, a smart phone, a palmtop, or a tablet computer.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for estimating a remaining capacity of a battery, said method comprising:
    charging said battery via a host device;
    measuring, with said host device, a battery voltage of said battery during said charging;
    determining, using said host device, whether said battery is defined as being close to being fully charged based on said battery voltage and a condition that defines when said battery is close to being fully charged; and
    when said battery is defined as being close to being fully charged, then performing a plurality of operations using said host device, wherein said operations comprise:
        counting charges passing in said battery to estimate a calculated remaining capacity of said battery by monitoring a charging current of said battery;
        calculating a calculated capacity ratio of said calculated remaining capacity to a capacity reference of said battery;
        comparing said charging current with a current reference to generate a first comparison result;
        comparing said calculated capacity ratio with a ratio reference to generate a second comparison result;
        setting an amount according to said first and second comparison results;
        providing a calibrated remaining capacity by increasing said calculated remaining capacity by said amount if said charging current is less than said current reference and if said calculated capacity ratio is less than said ratio reference;
        calculating a calibrated capacity ratio in percentage form of said calibrated remaining capacity to said capacity reference; and
        controlling a screen to display said calibrated capacity ratio in percentage form to a user.

2. The method as claimed in claim 1, further comprising:
    determining that said battery is defined as being close to being fully charged when said battery voltage increases to a voltage reference.

3. The method as claimed in claim 1, further comprising:
    counting said charges passing in said battery by multiplying said charging current of said battery by a time period of operation of said battery.

4. The method as claimed in claim 1, wherein said battery has a fully-charged capacity when said battery is fully-charged, and wherein said capacity reference comprises said fully-charged capacity.

5. The method as claimed in claim 1, further comprising:
    comparing said charging current with a first current reference and a second current reference to determine a range of said charging current;
    decreasing said first and second current references if said charging current is less than said first and second current references; and
    increasing said ratio reference if said first and second current references are decreased.

6. A system comprising:
    a battery; and
    a host device that enables charging from a charger to said battery, and determines whether said battery is defined as being close to being fully charged based on a battery voltage of said battery and a condition that defines when said battery is close to being fully charged, wherein when said host device determines that said battery is defined as being close to being fully charged, then said host device performs a plurality of operations comprising:
        counting charges passing in said battery to estimate a calculated remaining capacity of said battery by monitoring a charging current of said battery;
        calculating a calculated capacity ratio of said calculated remaining capacity to a capacity reference of said battery;
        comparing said charging current with a current reference to generate a first comparison result;
        comparing said calculated capacity ratio with a ratio reference to generate a second comparison result;
        setting an amount according to said first and second comparison results;
        providing a calibrated remaining capacity by increasing said calculated remaining capacity by said amount if said charging current is less than said current reference and if said calculated capacity ratio is less than said ratio reference;
        calculating a calibrated capacity ratio in percentage form of said calibrated remaining capacity to said capacity reference; and
        controlling a screen to display said calibrated capacity ratio in percentage form to a user.

7. The system as claimed in claim 6, wherein when said battery voltage increases to a voltage reference, then said host device determines that said battery is defined as being close to being fully charged.

8. The system as claimed in claim 6, wherein said host device counts said charges passing in said battery by multiplying said charging current of said battery by a time period of operation of said battery.

9. The system as claimed in claim 6, wherein said battery has a fully-charged capacity when said battery is fully-charged, and wherein said capacity reference comprises said fully-charged capacity.

10. The system as claimed in claim 6, wherein said host device compares said charging current with a first current reference and a second current reference to determine a range of said charging current and decreases said first and second current references if said charging current is less than said first and second current references, and wherein said host device increases said ratio reference if said first and second current references are decreased.

11. A method for estimating a remaining capacity of a battery, said method comprising:
    discharging said battery to power a host device;
    measuring, with said host device, a battery voltage of said battery during said discharging;
    determining, using said host device, whether said battery is close to being fully discharged based on said battery voltage and a condition that defines when said battery is close to being fully discharged; and when said battery is defined as being close to being fully discharged, then performing a plurality of operations using said host device, wherein said operations comprise:
    counting charges passing out of said battery to estimate a calculated remaining capacity of said battery by monitoring a discharging current of said battery;
    calculating a calculated capacity ratio of said calculated remaining capacity to a capacity reference of said battery;
    comparing said battery voltage with a first voltage reference to generate a first comparison result;
    comparing said calculated capacity ratio with a ratio reference to generate a second comparison result;
    setting an amount according to said first and second comparison results;
    providing a calibrated remaining capacity by decreasing said calculated remaining capacity by said amount if said battery voltage is less than said first voltage reference and said calculated capacity ratio is greater than said ratio reference;
    calculating a calibrated capacity ratio in percentage form of said calibrated remaining capacity to said capacity reference; and
    controlling a screen to display said calibrated capacity ratio in percentage form to a user.

12. The method as claimed in claim 11, further comprising:
    counting said charges passing out of said battery by multiplying said discharging current of said battery by a time period of operation of said battery.

13. The method as claimed in claim 11, wherein said battery has a fully-charged capacity when said battery is fully-charged, and wherein said capacity reference comprises said fully-charged capacity.

14. The method as claimed in claim 11, further comprising:
    comparing said battery voltage with said first voltage reference and a second voltage reference to determine a range of said battery voltage;
    decreasing said first and second voltage references if said battery voltage is less than said first and second voltage references; and
    decreasing said ratio reference if said first and second voltage references are decreased.

15. The method as claimed in claim 11, further comprising:
    determining that said battery is defined as being close to being fully discharged when said battery voltage decreases to a third voltage reference.

16. A system comprising:
a battery; and
a host device that is powered by said battery to discharge said battery, and determines whether said battery is defined as being close to being fully discharged based on a battery voltage of said battery and a condition that defines when said battery is close to being fully discharged, wherein when said host device determines that said battery is defined as being close to being fully discharged, then said host device performs a plurality of operations comprising:
    counting charges passing out of said battery to estimate a calculated remaining capacity of said battery by monitoring a discharging current of said battery;
    calculating a calculated capacity ratio of said calculated remaining capacity to a capacity reference of said battery;
    comparing said battery voltage with a first voltage reference to generate a first comparison result;
    comparing said calculated capacity ratio with a ratio reference to generate a second comparison result;
    setting an amount according to said first and second comparison results;
    providing a calibrated remaining capacity by decreasing said calculated remaining capacity by said amount if said battery voltage is less than said first voltage reference and said calculated capacity ratio is greater than said ratio reference;
    calculating a calibrated capacity ratio in percentage form of said calibrated remaining capacity to said capacity reference; and
    controlling a screen to display said calibrated capacity ratio in percentage form to a user.

17. The system as claimed in claim 16, wherein said host device counts said charges passing out of said battery by multiplying said discharging current of said battery by a time period of operation of said battery.

18. The system as claimed in claim 16, wherein said battery has a fully-charged capacity when said battery is fully-charged, and wherein said capacity reference comprises said fully-charged capacity.

19. The system as claimed in claim 16, wherein said host device compares said battery voltage with said first voltage reference and a second voltage reference to determine a range of said battery voltage, decreases said first and second voltage references if said battery voltage is less than said first and second voltage references, and decreases said ratio reference if said first and second voltage references are decreased.

20. The system as claimed in claim 16, wherein if said battery voltage decreases to a third voltage reference, then said host device determines that said battery is defined as being close to being fully discharged.

* * * * *